United States Patent [19] [11] 4,323,405
Uno et al. [45] Apr. 6, 1982

[54] CASING HAVING A LAYER FOR PROTECTING A SEMICONDUCTOR MEMORY TO BE SEALED THEREIN AGAINST ALPHA PARTICLES AND A METHOD OF MANUFACTURING SAME

[75] Inventors: Koichi Uno; Shinichi Murakami, both of Nagoya, Japan

[73] Assignee: Narumi China Corporation, Nagoya, Japan

[21] Appl. No.: 105,196

[22] Filed: Dec. 19, 1979

[30] Foreign Application Priority Data

Dec. 28, 1978 [JP] Japan ................................ 53/161168

[51] Int. Cl.³ ............................................ H01L 23/06
[52] U.S. Cl. ..................................... 156/64; 29/588; 156/89; 250/515; 357/80; 427/5; 427/9; 427/34; 427/96
[58] Field of Search .............. 357/80; 250/515; 427/5, 427/34, 96, 9; 156/89, 64; 29/588

[56] References Cited

U.S. PATENT DOCUMENTS 3,706,010 12/1972 Laermer et al. ...................... 357/80
3,769,560 10/1973 Miyake et al. ........................ 357/80
4,032,350 6/1977 Greenstein ............................ 357/80
4,081,825 3/1978 Koopman et al. .................... 357/80
4,099,200 7/1978 Koutalides ............................ 357/80
4,142,203 2/1979 Dietz .................................... 357/80

Primary Examiner—John D. Smith
Attorney, Agent, or Firm—Hopgood, Calimafde, Kalil, Blaustein & Lieberman

[57] ABSTRACT

A hermetic cap member of a casing for a semiconductor memory element is provided with a protection layer on a recessed surface facing the memory element. The protection layer is of at least one material which does not emit alpha particles and has a thickness sufficient to prevent alpha particles from being emitted from the cap member onto the memory element. Specifically, the protection layer may be a plate of a pertinent one of the following silicon of high purity, 42 alloy, or Kovar and is attached to the cap member by the use of an adhesive of glass frit. Alternatively, the protection layer may be made from a metallic paste of silver, silver-palladium, or gold-palladium by firing the same onto the cap member. The protection layer may also be magnesium oxide formed by the use of a plasma spray process. As a further alternative, the protection layer may consist of a plurality of materials.

2 Claims, 5 Drawing Figures

CASING HAVING A LAYER FOR PROTECTING A SEMICONDUCTOR MEMORY TO BE SEALED THEREIN AGAINST ALPHA PARTICLES AND A METHOD OF MANUFACTURING SAME

BACKGROUND OF THE INVENTION

This invention relates to a casing for a semiconductor memory element and a method of manufacturing the same.

A semiconductor memory element is typically fabricated by the technique of large-scale integration. Such a memory element is usually packaged in a casing. It has recently been found that the casing material emits alpha particles as will later be described with reference to the figures of the accompanying drawing. The alpha particles are strongly ionizing and adversely affect operation of the semiconductor memory element. For instance, the alpha particles cause bit or soft errors in the semiconductor memory element even when no physical errors are present in the element. The soft errors are quite annoying because they irregularly or temporarily take place.

SUMMARY OF THE INVENTION

It is therefore an object of the present invention to provide a casing for a semiconductor memory element which may emit alpha particles, and yet, has means is capable of preventing the alpha particles from reaching the semiconductor memory element.

It is another object of this invention to provide a casing of the type described, by which it is possible to avoid occurrence of soft errors in the semiconductor memory element.

It is a further object of this invention to provide a method of manufacturing a casing of the type described.

The invention is applicable to a method for manufacturing a casing for a semiconductor memory element. The casing comprises a base member and a cap member. The cap member has a peripheral region having a peripheral surface to be hermetically sealed to the base member, a center region surrounded by the peripheral region and having a center surface offset relative to the peripheral surface to form a hollow space in the casing when the base and the cap members are sealed together, and a wall surface between the center and the peripheral surfaces. The base member holds the semiconductor memory element in the hollow space. The material composing the cap member irregularly emits alpha particles that adversely affect operation of the semiconductor memory element. According to this invention, the method comprises the step of attaching a protection layer to the center surface. The protection layer is of at least one material and has a thickness sufficient to substantially prevent the alpha particles from being emitted into the hollow space.

DESCRIPTION OF THE PREFERRED EMBODIMENTS

Figure 1:
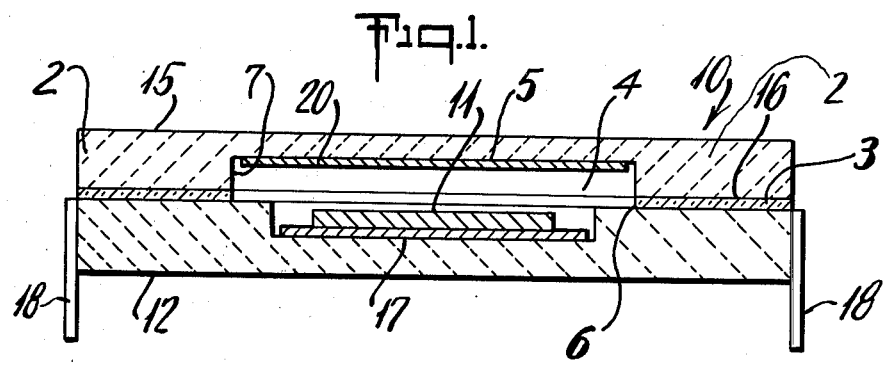
FIG. 1 shows a schematic sectional view of a casing according to a preferred embodiment of this invention, together with a semiconductor memory element and conductive leads attached thereto.

Referring to FIG. 1, a casing 10 according to a preferred embodiment of this invention is for enveloping a semiconductor memory element 11, such as a CCD or a dynamic RAM, and is made of a ceramic material such as white alumina or black alumina. Memory element 11 has a semiconductor substrate and a multiplicity of memory circuits which are usually formed adjacent to an upper surface of the substrate. Casing 10 comprises a base member 12 and a cap member 15. Cap member 15 has a peripheral region 2 having a peripheral surface 3 to be hermetically sealed on base member 12, a center region 4 surrounded by peripheral region 2 and having a center surface 5 offset relative to peripheral surface 3, and a wall surface 7 between the center and the peripheral surfaces. A hollow space is defined in casing 10 by the center region 4 when base and the cap members 12 and 15 are sealed together by the use of a layer 16 of glass frit. Base member 12 has front and back surfaces and an external side surface. In the example being illustrated, the front surface is possessed of a recessed center surface and a raised surface which surrounds the recessed center surface and is contiguous through an internal side surface to the recessed surface. A layer 17 of, for example, gold is attached to the recessed center surface of base member 12. Memory element 11 is mounted on layer 17, which serves as an electrode for memory element 11. A plurality of conductive leads 18 extend along the external side surface of base member 12 and are electrically connected to memory element 11 by conductors (not shown).

Casing 10 objectionably emits alpha particles from the base and the cap members 12 and 15 when uranium and/or thorium are included in the ceramic material composing casing 10. Alpha particles are also released from the glass frit in layer 16. Among others, alpha particles from cap member 15 are incident on memory element 11. The alpha particles from glass frit layer 16 are substantially negligible because layer 16 has a very small area at end 6 exposed to the hollow space enclosing memory element 11 as compared with the base and cap members 12 and 15. Substantially no alpha particles from base member 12 reach the memory circuits formed adjacent to the upper surface of the substrate. This shows that substantially only the alpha particles from cap member 15 reach the memory element and bring about soft errors. The soft errors become serious with an increase in the number of memory circuits integrated in memory element 11.

Further referring to FIG. 1, cap member 15 has a protection layer 20 to shield against the alpha particles disposed on the center surface 5 of cap member 15. It is preferred that wall surface 7 is rendered higher in height than that of a conventional cap member. Protection layer 20 comprises at least one material and has a thickness sufficient to substantially prevent alpha particles from being emitted into the hollow space. Specifically, the material used for protection layer 20 should not emit alpha particles. Further, protection layer 20 must have a thickness equal to at least the range or free path $R_1$ of the alpha particles emitted by the material. According to the Bragg-Kleeman rule, the range $R_1$ of alpha particles in a material is generally given by:

$$R_1 = 3.2 \times 10^{-4} \times (A^{\frac{1}{2}}/\rho) \times R_a, \tag{1}$$

where A and ρ represent the atomic weight and the density of the material, respectively, and $R_a$, the range of the alpha particles in air. Inasmuch as the range in air $R_a$ is given by the Bragg rule which is well-known in the art and the atomic weight A and the density ρ are predetermined for the material, it is possible to calculate the thickness of protection layer 20 which is sufficient to intercept the alpha particles, as will later be described in detail with reference to Examples 1 through 7.

In order to account for and evaluate the effectiveness of protection layer 20, intensities or amounts (particles emitted/(cm²hr)) of the alpha particles should be previously known with respect to cap members 15 of various ceramic materials. The soft errors are liable to be brought about by alpha particles of energy greater than 8 MeV. Accordingly, the alpha particles of energy greater than 3 MeV were measured around various cap members of black and white alumina ceramics by the use of a scintillation alpha counter. The measurement showed that the intensities of the alpha particles of energy greater than 3 MeV range between 1.78 and 0.05 and between 1.30 and 0.04 (particles/(cm²hr)), respectively.

EXAMPLE 1

Figure 2A:
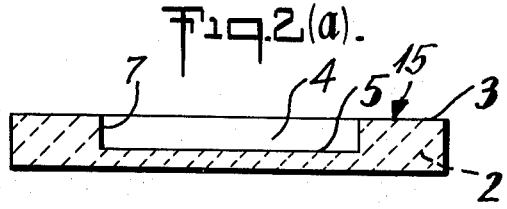
FIGS. 2(a) through 2(d) schematically show, by sectional views, several steps of a method according to an example of this invention.
Figure 2B:
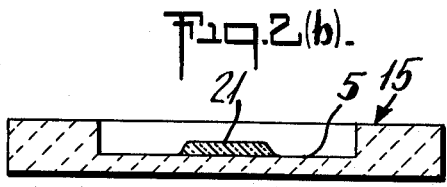
Figure 2C:
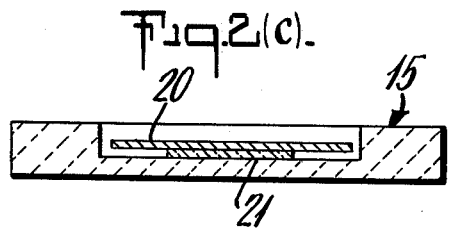
Figure 2D:
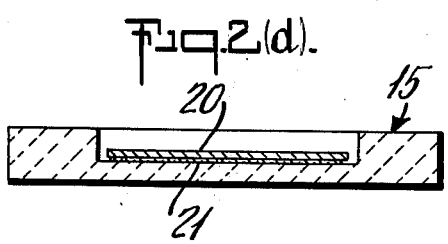

In FIG. 2(a), preparation is made of a cap member 15 of black alumina ceramic which is illustrated upside down. In FIG. 2(b), a paste of glass frit is partially dripped or coated on center surface 5 of cap member 15. Preferably, the glass frit is of the $R_2O$-$PbO$-$Al_2O_3$-$SiO_2$-$B_2O_3$ system, where R is an alkali metal, such as potassium or sodium. The paste is prepared by putting the glass frit in an organic binder, such as acrylic resin, dissolved in a pertinent solvent, such as xylene. Viscosity of the paste should be adjusted lest the paste flows to the wall surface. The paste is dried into a layer 21 of glass frit. In FIG. 2(c), protection layer 20 is placed on layer 21 of glass frit. The protection layer 20 should have a thickness great enough to intercept 8 MeV alpha particles of range $R_a$ of about 7.3 cm in air which is calculated in accordance with the Bragg rule as described before. In this example, protection layer 20 is a silicon sheet of extremely high purity, for example, eleven-nines. According to the Bragg-Kleeman rule, the range of the 8 MeV alpha particles in silicon is approximately equal to 53 microns because the atomic weight and the density of silicon are 28.1 g/mole and 2.33 g/cm³, respectively. From this fact, use of a silicon sheet of a thickness of at least 53 microns will intercept the 8 MeV alpha particles. The silicon sheet may be a wafer for a semiconductor integrated circuit. In FIG. 2(d), layer 21 of glass frit is fired at about 600° C. into a layer of glass frit in an oxidizing atmosphere. Protection layer 20 is attached to the center surface 5 of cap member 15 by layer 21 of glass frit. Thus, most of the center surface of cap member 15 is covered with protection layer 20 comprising a silicon sheet. As described, the glass frit should not flow to the remaining uncovered portion of the center surface. Otherwise, the glass frit may act as a source of alpha particles. Subsequently, sealing glass solder is printed on peripheral surface 3 of cap member 15 and is fired in a conventional manner. Thus, the cap member is provided with protection layer 20. Cap member 15 is sealed together with the base member on which the semiconductor memory element has been previously bonded. The measurement of the alpha particles was carried out by the use of the counter described hereinbefore The results indicated that the amount of alpha particles emitted onto the semiconductor memory element was reduced to less than 0.01 (particles/(cm²hr)).

EXAMPLE 2

Protection layer 20 is made of a sheet of a so-called 42 alloy comprising, by weight, 42% of nickel and 58% of iron. Prior to calculation of the range $R_1$ in the 42 alloy by the use of Equation (1) above, the average atomic weight and average density of the 42 alloy should be determined. As described in "The Atomic Nucleus," page 653, by E. D. Evans (published by McGraw-Hill Book Co. Inc., New York, 1955), an average atomic weight A of an alloy or a compound is given by:

$$A^{\frac{1}{2}} = (n_1 A_1 + n_2 A_2 + n_3 A_3 + \ldots) / (n_1 A_1^{\frac{1}{2}} + n_2 A_2^{\frac{1}{2}} + n_3 A_3^{\frac{1}{2}} + \ldots), \quad (2)$$

where $n_1, n_2, n_3, \ldots$, represent atomic weight fractions of constituents of the alloy and $A_1, A_2, A_3, \ldots$, atomic weights thereof. According to Equation (2), the average atomic weight of the 42 alloy is equal to about 57.2 g/mole. The average density of the alloy is about 8.2 g/cm³. As is the case with Example 1, substitution of 57.2 g/mole, 8.2 g/cm³, and 7.3 cm into Equation (1) gives about 21.5 microns. This shows that the range $R_1$ of the 8 MeV alpha particles in the 42 alloy is about 21.5 microns. Therefore, a sheet of the 42 alloy must have a thickness equal to at least 21.5 microns in order to be useful as a protection layer. Practically, use is made of a 42 alloy sheet 25 microns thick.

As in Example 1, a paste is prepared which comprises glass frit of the $R_2O$-$CaO$-$Al_2O_3$-$SiO_2$-$B_2O_3$ system, where R represents an alkali metal. The paste is applied on the center surface of cap member 15 as in Example 1 and dried thereon to form a layer of glass frit. sheet of the 42 alloy is placed on the layer of glass frit. The glass frit is subjected to preliminary firing at a temperature between 400° C. and 500° C. in an oxidizing atmosphere and then fired at about 800° C. into a hardened mass of glass frit. Thus, the 42 alloy sheet is firmly attached to the center surface of cap member 15 by the glass frit and serves as protection layer 20 against the alpha particles. It was confirmed by the use of the counter described above that the amount of alpha particles emitted onto semiconductor memory element 11 was less than 0.01 (particles/(cm²hr)).

EXAMPLE 3

A paste is prepared by putting glass frit of $BaO$-$CaO$-$Al_2O_3$-$SiO_2$-$B_2O_3$ system in an organic binder such as acrylic resin dissolved in a solvent such as xylene. The paste is applied on the center surface of a cap member 15 of a white alumina ceramic material including 94% by weight of $Al_2O_3$ and is dried on the center surface into a layer of the glass frit. Preparation is made of a plate of Kovar which comprises, by weight, 29% of nickel and 17% of cobalt, the balance being iron. From Equation (2), the average atomic weight of Kovar is 57.2 g/mole. The average density of Kovar is 8.3 g/cm³. As in Examples 1 and 2, the range of the 8 MeV alpha particles in Kovar is about 20.9 microns from Equation (1). Therefore, the Kovar sheet must be at least 20.9 microns thick to intercept the 8 MeV alpha particles. Practically, use is made of a Kovar sheet of 24 microns thickness is used in the example being described. The Kovar sheet is put on layer of the glass frit. The glass frit is subjected to preliminary firing at 500°

C. in an oxidizing atmosphere and is thereafter fired again at 1100° C. in a reducing atmosphere. Thus, the Kovar sheet is fixedly attached, as protection layer 20, to the center surface of the cap member by the glass frit mass. With the cap member according to Example 3, the alpha particles emitted onto the semiconductor memory element was at most 0.01 (particles/(cm$^2$hr)).

EXAMPLE 4

As the material for protection layer 20, use is made of silver having an atomic weight of 107.9 g/mole and a density of 10.5 g/cm$^3$. According to Equation (1), the range of 8 MeV alpha particles in silver is about 23.1 microns. A paste is prepared by putting silver powder in a binder, such as ethyl cellulose dissolved in a solvent, for example, ethylene glycol mono-n-butyl ether, or diethylene glycol monobutyl ether acetate. The paste is applied on a center surface of a cap member of a black alumina ceramic material including 90% by weight of Al$_2$O$_3$. The paste is fired at 850° C. into a protection layer of about 25 microns thickness. With this example, it was confirmed that the alpha particles emitted onto the semiconductor memory element was at most 0.01 (particles/(cm$^2$hr)).

EXAMPLE 5

The protection layer 20 is formed from a solid solution of silver-palladium which comprises, by weight, 97% of silver and 3% of palladium. The atomic weight and the density of the solid solution may be considered to be equal to those of silver described in Example 4, namely about 107.9 g/mole and 10.5 g/cm$^3$, respectively, because of the insubstantial amount of palladium. From Equation (1), it is obvious that the 8 MeV alpha particles would have a range of about 23.1 microns in the silver-palladium. This means that a layer produced from the solid solution must be at least 23.1 microns thick.

First, the solid solution of silver-palladium is dripped on the center surface of a cap member of a black alumina ceramic material including 90% by weight of Al$_2$O$_3$. The amount of the solid solution is controlled so that the produced layer becomes at least 23.1 microns thick. The solid solution of silver-palladium is fired at 900° C. in an oxidizing atmosphere to form a protection layer of the solid solution of about 25 microns thickness after being dried on the center surface of the cap member. The alpha particles emitted onto semiconductor memory element 11 was found to be at most 0.01 (particles/(cm$^2$hr)). The silver paste and the solid solution used in Examples 4 and 5 are tightly adhered to the center surface of the cap member. Accordingly, no adhesive is required between protection layer 20 and center surface 5 of cap member 15.

EXAMPLE 6

Protection layer 20 comprises magnesium oxide having the average atomic weight of 21.4 g/mole and the average density of 3.65 g/cm$^3$. From Equation (1), the range of 8 MeV alpha particles is about 29.6 microns in magnesium oxide. The magnesium oxide is coated by a plasma spray process, in the form of particles between 20 and 30 microns in size, on a center surface of a cap member of a black alumina ceramic material including 90% by weight of Al$_2$O$_3$. The layer of magnesium oxide is porous in order to reduce the difference between the thermal expansion coefficients of the magnesium oxide layer and cap member 15 and should, therefore, be 100 microns thick although the minimum thickness of the magnesium oxide layer is about 29.6 microns as described above. The wall surface 7 of cap member 15 is also coated with the magnesium oxide protection layer as well as center surface 5 because of the use of the plasma spray process. Inasmuch as the magnesium oxide itself emits no alpha particle, alpha particles from the wall surface are also intercepted in this example.

EXAMPLE 7

A gold paste, known in the art, is prepared and is applied on the center surface of a cap member of a black or a white alumina ceramic material. The gold paste is fired at a temperature between 800° C. and 900° C. into a first film. A plate of a gold-silicon alloy is placed as a second film on the first film. A silicon plate, as used in Example 1, is superimposed on the second film. first and the second films and the silicon plate are subjected to a heat treatment of about 500° C. to cause them to combine. Specifically, the first and the second films are 10 and 5 microns thick, respectively, and the silicon plate is 53 microns thick. The combination has a thickness sufficient to intercept the 8 MeV alpha particles released from the cap member. In this example, the alpha particles emitted onto the memory element was reduced to 0.01 (particles/(cm$^2$hr)). Thus, protection layer 20 may consist of a plurality of materials.

It should also be noted, as described above, protection layer 20 is attached to the center surface of the cap member by the use of glass frit layer 21 in Examples 1 through 3 while it is attached thereto without any glass frit in Examples 4 through 7. Accordingly, adhesive layers are not always required to practice the invention.

While several illustrative embodiments of this invention have so far been described, it is now readily possible for those skilled in the art to practice this invention in various manners. For example, the cap and the base members may not be always of a ceramic material. In other words, this invention is applicable to any cap member of a material which objectionably ejects alpha particles. Furthermore, other protection layer materials may be used. For example, use is possible of a solid solution of gold-palladium, instead of silver-palladium.

What is claimed is:

1. A method of manufacturing a casing for a semiconductor memory element, said element having a semiconductor substrate and a plurality of memory circuits, said substrate having a first surface and a second surface opposite to said first surface, said memory circuits being formed adjacent to said first surface, said casing comprising:

a base member and a cap member, said cap member having a peripheral region having a peripheral surface to be hermetically sealed on said base member, a center region surrounded by said peripheral region and having a center surface offset relative to said peripheral surface to form a hollow space in said casing when said base and said cap members are sealed together, and a wall surface between said center and said peripheral surface, said substrate being held on said base member with said first surface directed to said hollow space, and with said second surface brought into contact with said base member, said cap member irregularly emitting alpha particles that adversely affect operation of said semiconductor memory element, said method comprising the step of:

preparing at least one protected material against said alpha particles;

determining a thickness of a protection layer formed by said protective material, said thickness being not less than the range in said protective material of said alpha particles emitted by said cap member; and attaching said protection layer to said center surface to prevent said alpha particles from being emitted from said cap member into said hollow space and onto said first surface.

2. The method as claimed in claim 1 wherein said determining step comprises calculating the free path of alpha particles in said material according to the Bragg-Kleeman rule.

* * * * *